US006169466B1

(12) United States Patent
Goulouev

(10) Patent No.: US 6,169,466 B1
(45) Date of Patent: Jan. 2, 2001

(54) CORRUGATED WAVEGUIDE FILTER HAVING COUPLED RESONATOR CAVITIES

(75) Inventor: Rousslan Goulouev, Cambridge (CA)

(73) Assignee: COM DEV Limited, Cambridge (CA)

(*) Notice: Under 35 U.S.C. 154(b), the term of this patent shall be extended for 0 days.

(21) Appl. No.: 09/309,406

(22) Filed: May 10, 1999

(51) Int. Cl.[7] ................................ H01P 1/20; H03H 7/38
(52) U.S. Cl. ................................ 333/210; 333/34
(58) Field of Search ................................ 333/210, 208, 333/34

(56) References Cited

U.S. PATENT DOCUMENTS

| | | | |
|---|---|---|---|
| 1,788,538 | 1/1931 | Norton . | |
| 1,849,656 | 3/1932 | Bennett . | |
| 2,540,488 | 2/1951 | Mumford . | |
| 2,585,563 | 2/1952 | Lewis et al. . | |
| 3,046,503 | 7/1962 | Cohn . | |
| 3,271,706 | 9/1966 | Rooney . | |
| 3,597,710 | 8/1971 | Levy . | |
| 3,611,214 * | 10/1971 | Gerlack | 333/208 |
| 3,621,483 | 11/1971 | Craven . | |
| 3,634,788 | 1/1972 | Craven . | |
| 3,639,862 | 2/1972 | Craven et al. . | |
| 3,819,900 | 6/1974 | Ironfield . | |
| 3,838,368 | 9/1974 | Ironfield . | |
| 3,949,327 | 4/1976 | Chapell . | |
| 4,155,056 | 5/1979 | Cross et al. . | |
| 4,492,020 | 1/1985 | Cobb . | |
| 4,626,809 | 12/1986 | Mizumura et al. . | |
| 4,646,039 | 2/1987 | Saad . | |
| 4,673,903 | 6/1987 | Saad . | |
| 4,749,973 | 6/1988 | Kaneko et al. . | |
| 5,004,993 | 4/1991 | Reindel . | |
| 5,243,618 | 9/1993 | Dolezal et al. . | |
| 5,357,591 | 10/1994 | Jiang et al. . | |
| 5,381,596 | 1/1995 | Ferro . | |
| 5,598,300 | 1/1997 | Magnusson et al. . | |
| 5,600,740 | 2/1997 | Asfar . | |
| 5,715,271 | 2/1998 | Huang et al. . | |

OTHER PUBLICATIONS

"Tapered Corrugated Waveguide Low–Pass Filters", R. Levy, IEEE Transactions On Microwave Theory And Techniques, Aug. 1973, vol. MTT–21, pp. 526–532.

"Microwave Filters, Impedance–Matching Networks, and Coupling Structures", G. Matthaei, L. Young, E. Jones, Artech House, Inc., 1980, pp. 380–381.

* cited by examiner

*Primary Examiner*—Benny Lee
*Assistant Examiner*—Patricia T. Nguyen
(74) *Attorney, Agent, or Firm*—Jones, Day, Reavis & Pogue

(57) ABSTRACT

A corrugated waveguide filter has a plurality of coupled resonator cavities arranged in a horizontal or vertical manner. The filter may include an input transformer section and an output transformer section for matching the filter to external waveguide lines. Each resonator includes at least two extracted slots (or cavities) that are grouped in close proximity to each other, and which may be symmetrically or asymmetrically implemented in the waveguide. The resonators each contribute one reflection zero and two transmission zeros to the frequency response of the filter, the reflection zero being located within the pass-band of the filter, and the two transmission zeros located either at the high-side or low-side of the pass-band depending upon whether the resonator is a low-pass type or a high-pass type. The dimensions of each resonator, including the depth of the slots and the distance between the slots, determines the position of the reflection zero and whether the resonator is low-pass or high-pass.

31 Claims, 14 Drawing Sheets

CORRUGATED WAVEGUIDE FILTER HAVING COUPLED RESONATOR CAVITIES

CROSS-REFERENCE TO RELATED APPLICATION

This application is related to pending U.S. patent application Ser. No. 09/267,096, entitled "Waveguide Filter Having Asymmetrically Corrugated Resonators," which was filed on Mar. 12, 1999. This related application is hereby incorporated into this disclosure by reference.

BACKGROUND OF THE INVENTION

1. Technical Field

The present invention is directed to the field of electronic filters. More particularly, the present invention provides a compact waveguide filter providing band-pass or low-pass response in the microwave frequency range.

2. Description of the Related Art

Waveguide filters are known in this art. There are two primary types of filters for use in the microwave frequency range (i.e. from about 2–20 GHz)—symmetrically corrugated filters and iris filters. However, both of these types of filters suffer from many disadvantages.

An example of a symmetrically corrugated filter is shown in U.S. Pat. No. 3,597,710 to Levy ("the '720 patent"). FIG. 1 of the '720 patent shows a standard E-plane corrugated structure having a uniform waveguide channel with a plurality of symmetrical corrugations. But as noted in the '720 patent, these types of corrugated filters are typically low-pass only. Such a filter typically cannot provide a band-pass response.

The '720 patent purports to have advantages over the standard corrugated structure by forming a plurality of capacitive irises. Instead of forming a uniform waveguide channel, the '720 patent provides a series of iris structures (FIGS. 2 and 6), which have different heights. Although the irises and the corrugations are of different height, for any one iris or corrugation the structure is symmetrical. Another example of an iris filter (known as an H-plane iris filter) is shown in U.S. Pat. No. 2,585,563 to Lewis, et al. This type of iris filter suffers from many disadvantages, however. First, it typically provides band-pass response only, i.e., it is incapable of providing a combination response, such as low-pass and band-pass, or just a low-pass response. Secondly, the iris filter is typically a large structure, as the irises are generally separated along the waveguide channel by a half of a wavelength ($\lambda g/2$). Since the number of irises typically correlates to the order of the filter, when the order of the filter is high, such as 5th order or greater, the filter is very large.

Other types of filters include resonant iris filters (as shown in U.S. Pat. No. 1,788,538 to Norton and U.S. Pat. No. 1,849,659 to Bennett) and evanescent-mode ridged filters (as shown in U.S. Pat. No. 4,646,039 to Saad). The resonant iris filter utilizes a plurality of resonant diaphragms as resonating elements that are separated by a quarter of a wavelength ($\lambda g/4$). The evanescent-mode ridged filter is based on a wavelength structure with a ridged cross section. However, a common problem with both of these types of filters is that they typically cannot handle high-powered signals.

Therefore, there remains a general need in this field for a compact waveguide filter that provides multi-order band-pass or low-pass response, and is capable of handling high-powered signals in the GHz range.

SUMMARY OF THE INVENTION

A corrugated waveguide filter is provided having a plurality of coupled resonator cavities arranged in a horizontal or vertical manner. The filter may also include an input transformer section and an output transformer section for matching the filter to external waveguide lines. Each resonator includes at least two extracted slots (or cavities) that are grouped in close proximity to each other, and which may be symmetrically or asymmetrically implemented in the waveguide. The resonators each contribute one reflection zero and two transmission zeros to the frequency response of the filter, the reflection zero being located within the pass-band of the filter, and the two transmission zeros located either at the high-side or low-side of the pass-band, depending upon whether the resonator is a low-pass type or a high-pass type. The dimensions of the resonator, including the depth of the slots and the distance between the slots, determines the position of the reflection zero and whether the resonator is low-pass or high-pass.

According to one aspect of the invention a corrugated waveguide filter is provided that includes an input transformer section and an output transformer section for connecting the waveguide filter to external waveguide lines, wherein each transformer section includes at least one stepped waveguide section and provides a reflection zero to the frequency response of the filter, and a filter section coupled between the input transformer section and the output transformer section, the filter section including a waveguide channel and a plurality of coupled resonator cavities, wherein each coupled resonator cavity provides a reflection zero and two transmission zeros to the frequency response of the filter.

Another aspect of the invention provides a corrugated waveguide filter having a waveguide channel and a plurality of coupled resonator cavities extracted from the waveguide channel, each resonator cavity including two extracted slots, wherein the distance between the slots in each resonator determines its resonant frequency.

Still another aspect of the invention provides a corrugated waveguide filter having a plurality of horizontally-spaced coupled resonator cavities, wherein each resonator contributes one reflection zero and two transmission zeros to the frequency response of the filter, and a plurality of coupling transformers for connecting the resonator cavities, wherein each coupling transformer vertically connects two resonator cavities.

It should be noted that these are just some of the many aspects of the present invention. Other aspects not specified will become apparent upon reading the detailed description set forth below.

The present invention overcomes the disadvantages of presently known filters and also provides many advantages, such as: (1) compact size; (2) high-powered capability; (3) sharp roll-off on both sides of the pass-band; (4) low insertion loss; (5) wide and deep rejection response; (6) optional transformer units; and (7) either horizontal or vertical implementations.

These are just a few of the many advantages of the present invention, which is described in more detail below in terms of the preferred embodiments. As will be appreciated, the invention is capable of other and different embodiments, and its several details are capable of modifications in various respects, all without departing from the spirit of the invention. Accordingly, the drawings and description of the preferred embodiments set forth below are to be regarded as illustrative in nature and not restrictive.

BRIEF DESCRIPTION OF THE DRAWINGS

The present invention satisfies the general need noted above and provides many advantages, as win become apparent from the following description when read in conjunction with the accompanying drawings, wherein.

DETAILED DESCRIPTION OF THE DRAWINGS

Figure 1:
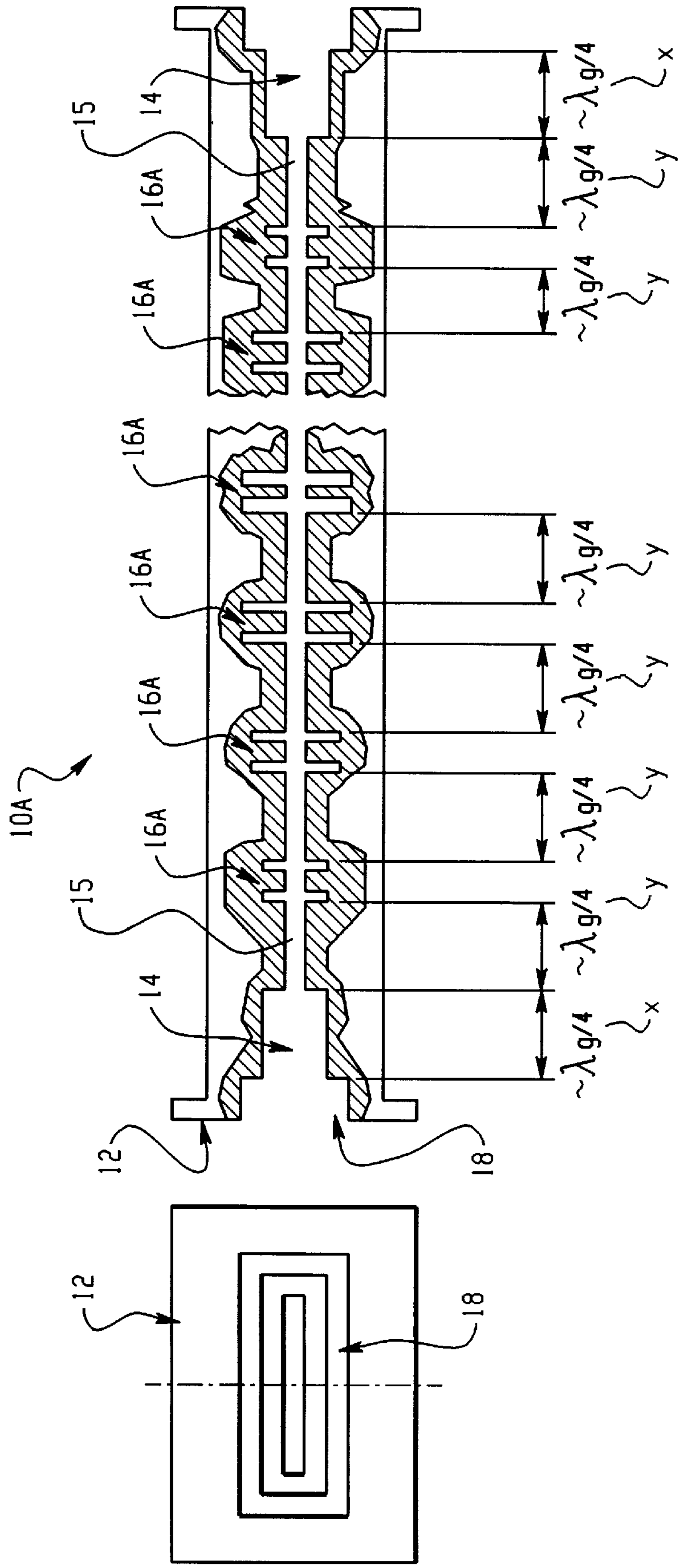
FIG. 1 is an E-plane cross-section and end-view of a corrugated waveguide filter according to the present invention having a plurality of symmetrical resonators arranged in a horizontal manner.

Turning now to the drawing figures, FIG. 1 is an E-plane cross-section and end-view of a corrugated waveguide filter 10A according to the present invention having a plurality of symmetrical resonators 16A arranged in a horizontal manner. The filter 10A includes interface flanges 12, quarter-wave transformer sections 14, external waveguide connections 18, and a plurality of symmetrical resonators 16A. The interface flanges 12 connect the waveguide 10A to external waveguide line (not shown). The quarter-wave transformers 14 couple the external waveguide line to the internal portion of the filter, where the waveguide channel 15 is formed, and where the filtering takes place. The waveguide channel 15 provides a path for electromagnetic energy flow through the filter. The resonators 16A are formed within the side walls of the waveguide channel 15. As described in more detail below, each of the resonators 16A includes a pair of closely-spaced (i.e. much less than $\lambda g/4$) corrugated cavities (or slots), thus forming a coupled resonator cavity 16A. The structure, spacing and configuration of these corrugated resonators 16A determines the frequency response of the filter.

The resonators 16A in FIG. 1 are symmetrical in the sense that the corrugated slots that form the resonator couple extend into both of the side walls of the waveguide channel 15. In the embodiment of the invention shown in FIG. 2, the resonators are asymmetrical since the corrugated slots extend into only one of the waveguide channel 15 side walls. The resonators are preferably separated ("y") by a quarter of a wavelength of the central frequency of the pass-band ($\lambda g/4$) of the filter, although they could be separated by a longer or shorter distance. The transformer sections 14 are also preferably $\lambda g/4$ in length ("x"), although they could be of a different length. Each of the transformer sections 14 contributes a reflection zero to the frequency response of the filter Each of the resonators 16A provides a reflection zero within the pass-band of the filter, and also provides a second-order transmission zero (i.e. two transmission zeros) on either the high-side or low-side of the pass-band. The resonators 16A can be of two types—low-pass or high-pass. The low-pass resonators have corrugated slots (or cavities) in which the depth of the cavities is less than $\lambda g/4$, and the high-pass resonators have corrugated slots in which the depth of the cavities is greater than $\lambda g/4$.

The filter 10A shown in FIG. 1 provides an Nth-order bandpass response, where N is the number of resonators 16A formed in the structure. If the transformer units 14 are utilized, then the order of the filter is N+2, as each transformer 14 contributes a reflection zero within the pass-band of the filter. Because each of the internal resonators 16A also provides second-order transmission zeros either below or above the pass-band, the roll-off at the edges of the pass-band is sharp and wide. The filter response can be designed to be of many types, including Chebychev or maximally-flat, for example.

Figure 2:
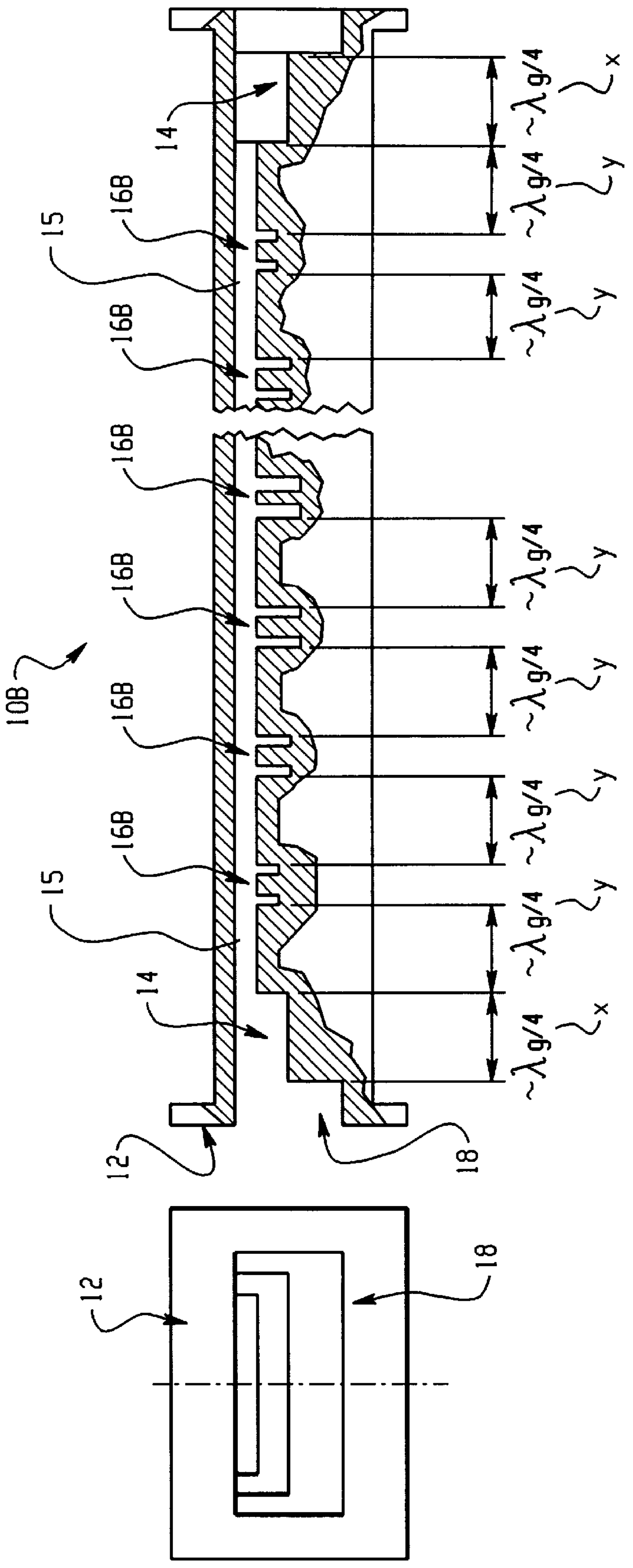
FIG. 2 is an E-plane cross-section and end-view of another corrugated waveguide filter according to the present invention having a plurality of asymmetrical resonators arranged in a horizontal manner.

FIG. 2 is an E-plane cross-section and end-view of another corrugated waveguide filter 10B according to the present invention having a plurality of asymmetrical resonators 16B arranged in a horizontal manner. The elements of the filter in FIG. 2 are the same as in FIG. 1, except that the corrugations in the waveguide channel 15 are formed on only one side wall. Although the performance of this type of filter is slightly less than the filter shown in FIG. 1, it provides many of the same advantages since the coupled resonator pairs 16B operate in the same fashion as the coupled resonator pairs 16A in FIG. 1—i.e. each resonator 16B contributes a reflection zero within the pass-band of the filter and two transmission zeros on one side of the pass-band.

The waveguide filters 10A, 10B are preferably made of aluminum, although other materials could be used. In addition, these filters preferably operate in the microwave region between 2 and 20 GHz, however they could easily operate at other frequencies. The filters are particularly well-suited for high-powered microwave signals.

Figure 3A:
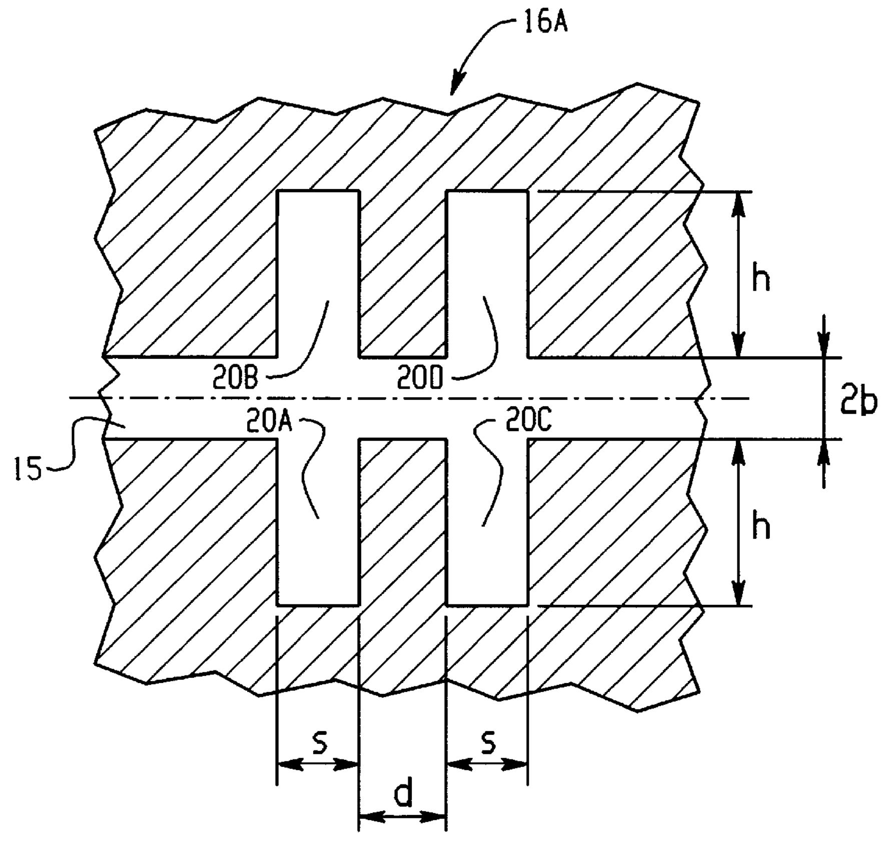
FIG. 3A is an E-plane cross-section of one of the symmetrical resonators in FIG. 1.
Figure 3B:
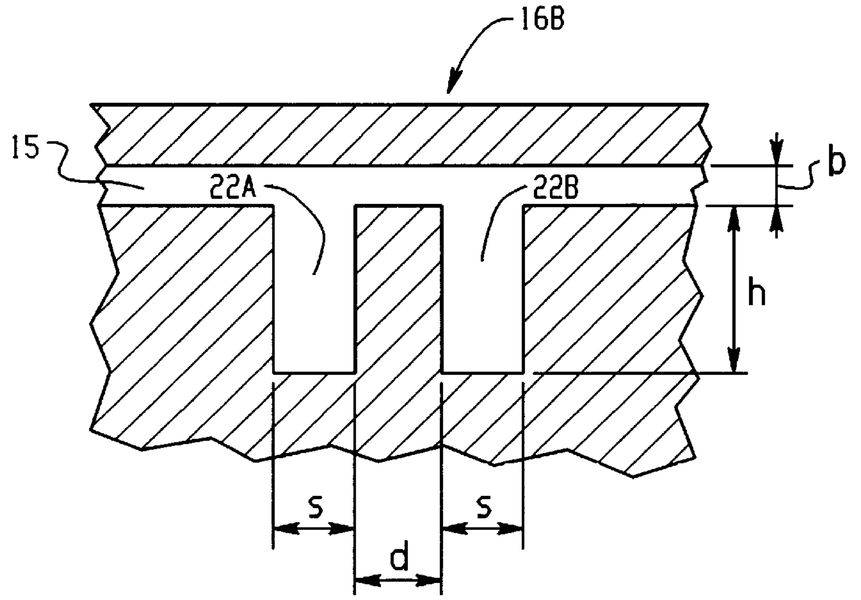
FIG. 3B is an E-plane cross-section of one of the asymmetrical resonators in FIG. 2.

FIG. 3A is an E-plane cross-section of one of the symmetrical resonators 16A shown in FIG. 1, and FIG. 3B is the same for one of the asymmetrical resonators 16B shown in FIG. 2. The symmetrical resonator 16A includes a pair of extracted cavities. A first cavity having two extracted slots 20A, 20B, and a second cavity also having two extracted slots 20C, 20D. The two slots in a given cavity are separated by the waveguide channel 15, which has a dimension 2*b*. The width of the dimension 2*b* effects the power-handling capability of the filter. Each slot 20A, 20B, 20C, 20D has dimensions "h" and "s", where "h" is the depth of the slot and "s" is the width of the slot. The two cavities are, in turn, separated by a distance "d".

The distance between the cavitites "d" determines the resonant frequency of the resonator couple, and hence the position of the reflection zero. The dimension "h" of the slots determines the position of the transmission zeros, either higher than or lower than the pass-band of the filter. If the dimension "h" is less than λg/4, then the transmission zeros are on the high-side of the pass-band, and therefore the resonator is a low-pass type. Alternately, if the dimension "h" is greater than λg/4, then the transmission zeros are on the low-side of the pass-band, and therefore the resonator is a high-pass type. For the high-pass type resonator, the distance "h" is typically between λg/4 and λg/2. The "s" dimension, as well as the "h" dimension, determine the loaded quality factor of the resonator.

Like FIG. 3A, the resonator shown in FIG. 3B includes two coupled cavities (or slots) 22A, 22B separated by a distance "d". This resonator 16B is asymmetrical in that the slots are extracted from only one side of the waveguide channel 15 sidewall. Other than a slight difference in performance, this resonator operates according to the same principles as that in FIG. 3A. The distance "d" determines the location of the reflection zero within the pass-band of the filter, the distance "h" determines the positioning of the transmission zeros (and hence whether the resonator is low-pass or high-pass), and the distance "s" effects the loaded quality factor of the resonator.

Figure 4:
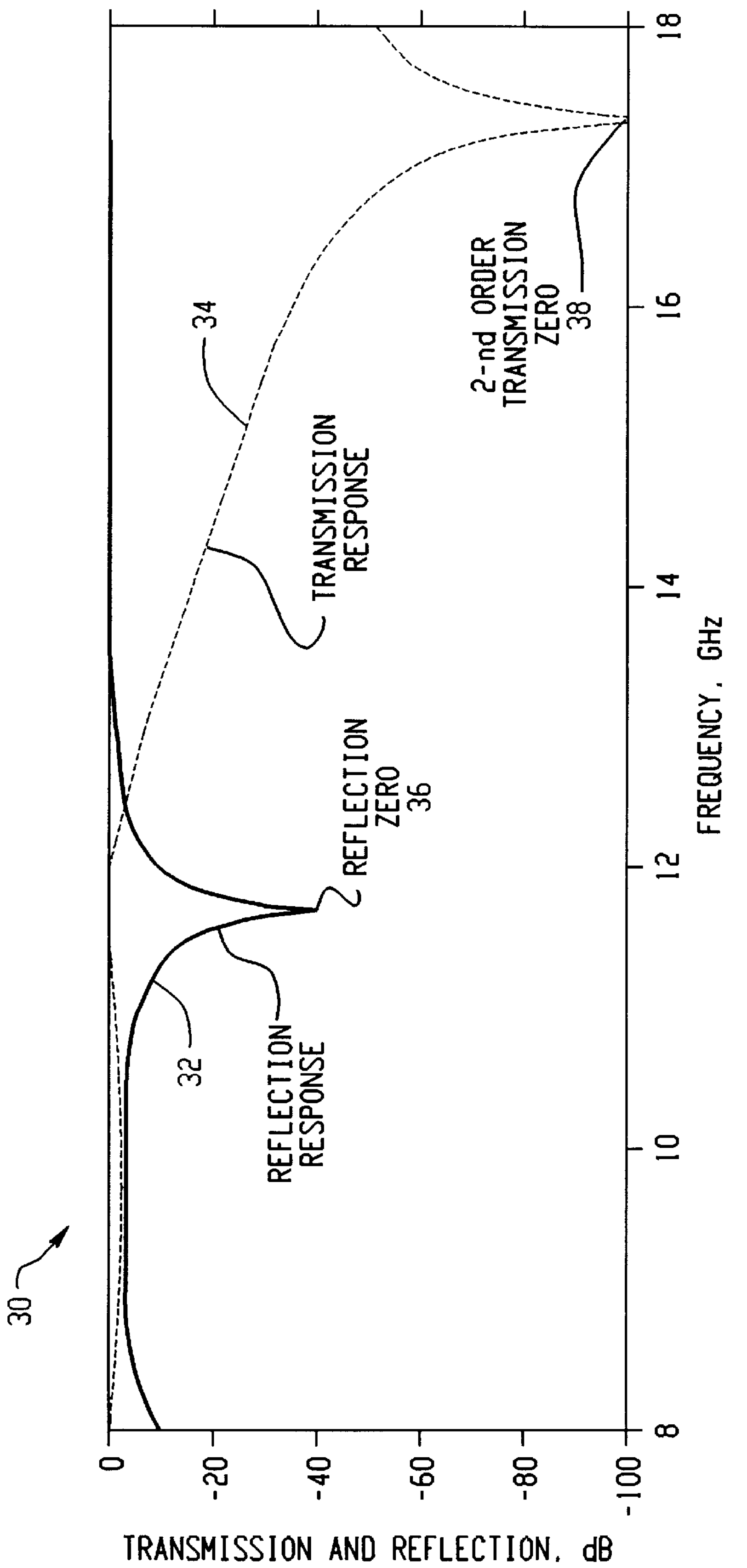
FIG. 4 is a plot showing the transmission and reflection frequency response of a low-pass resonator.
Figure 5:
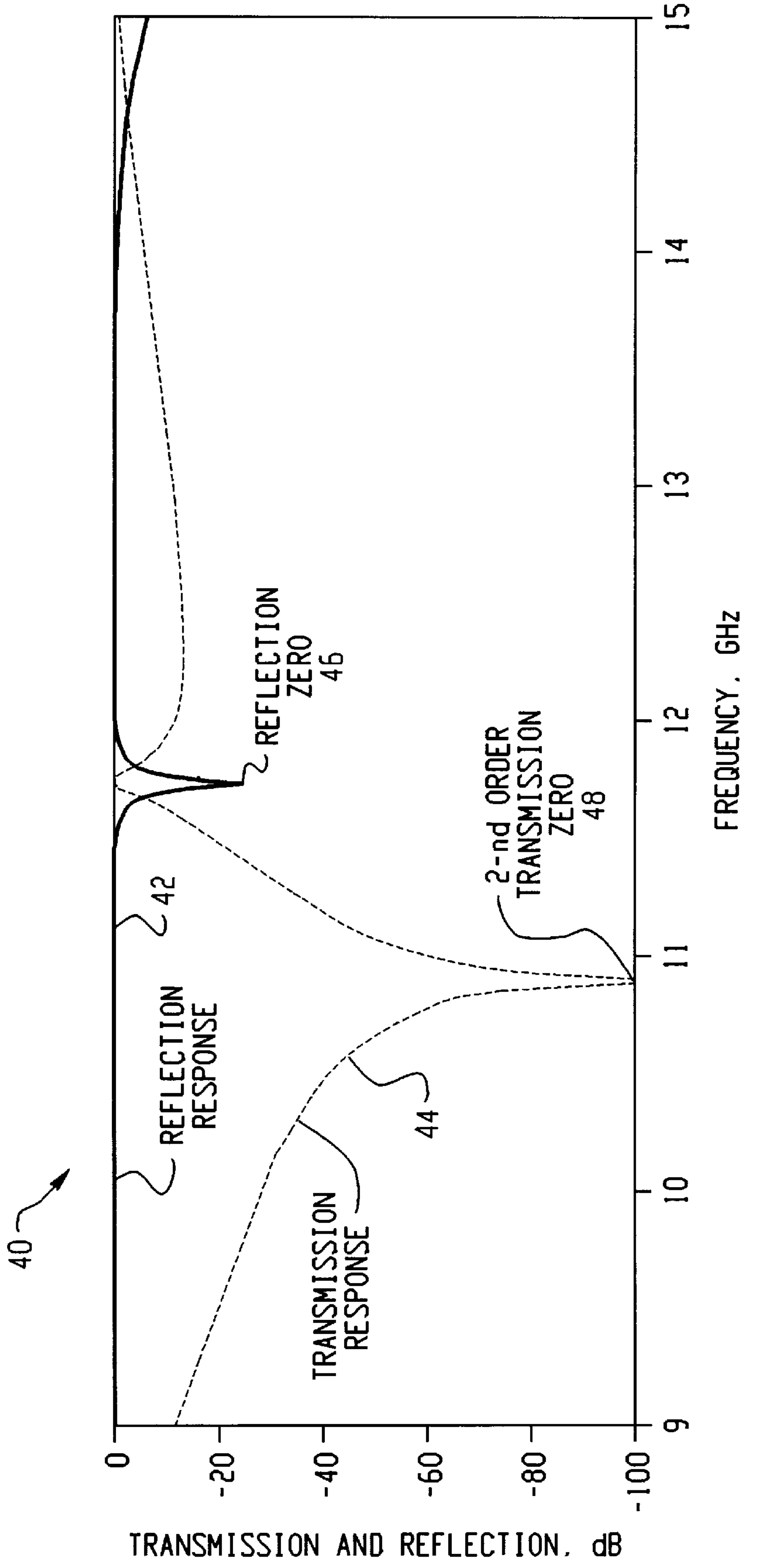
FIG. 5 is a plot showing the transmission and reflection frequency response of a high-pass resonator.
Figure 6A:
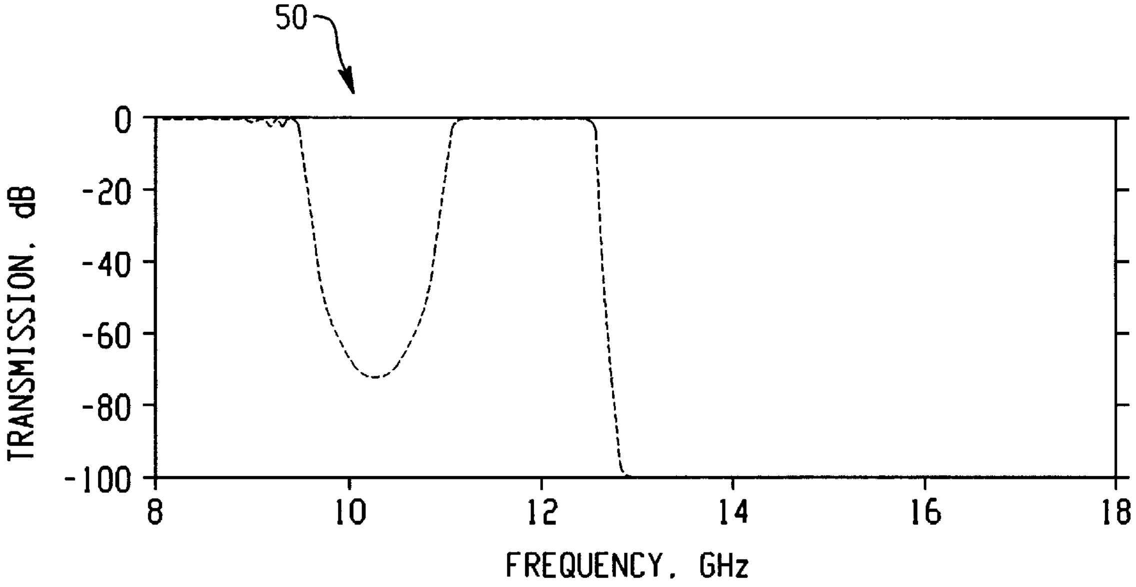
FIG. 6A is a plot showing the transmission frequency response of a filter such as shown in FIGS. 1 or 2, in which the resonators are all low-pass.
Figure 6B:
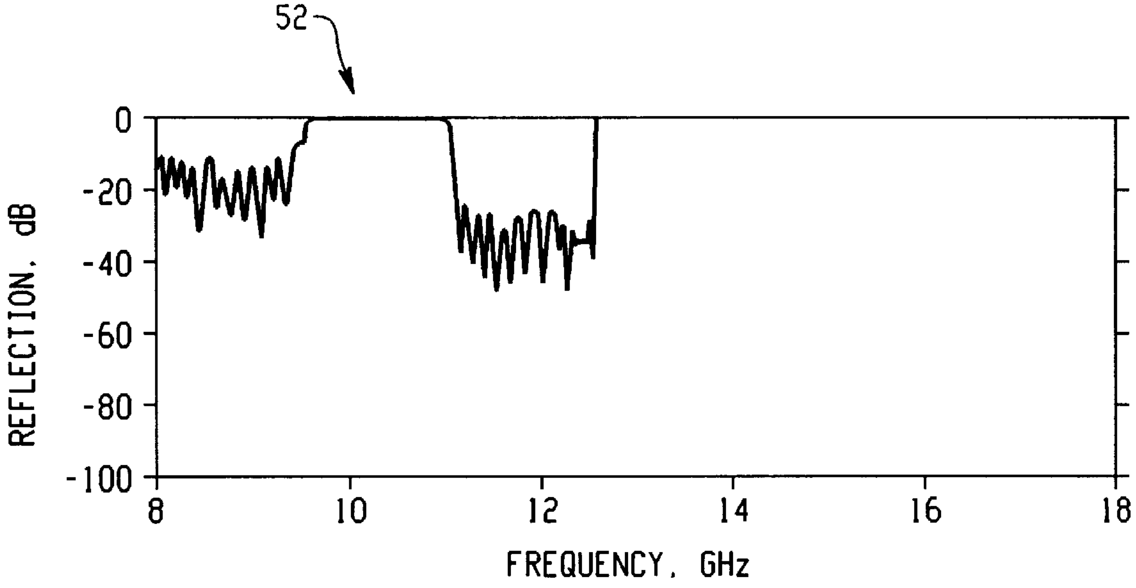
FIG. 6B is a plot showing the reflection frequency response of a filter such as shown in FIGS. 1 or 2, in which the resonators are all low-pass.
Figure 7A:
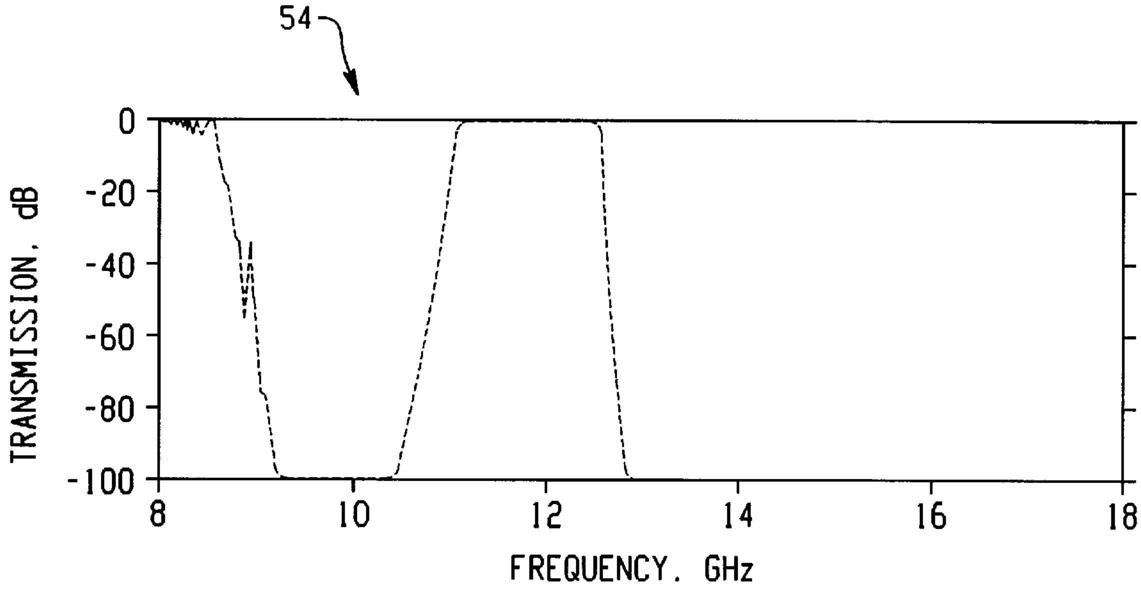
FIG. 7A is a plot showing the transmission frequency response of a filter such as shown in FIGS. 1 or 2, in which the resonators are both low-pass and high-pass.
Figure 7B:
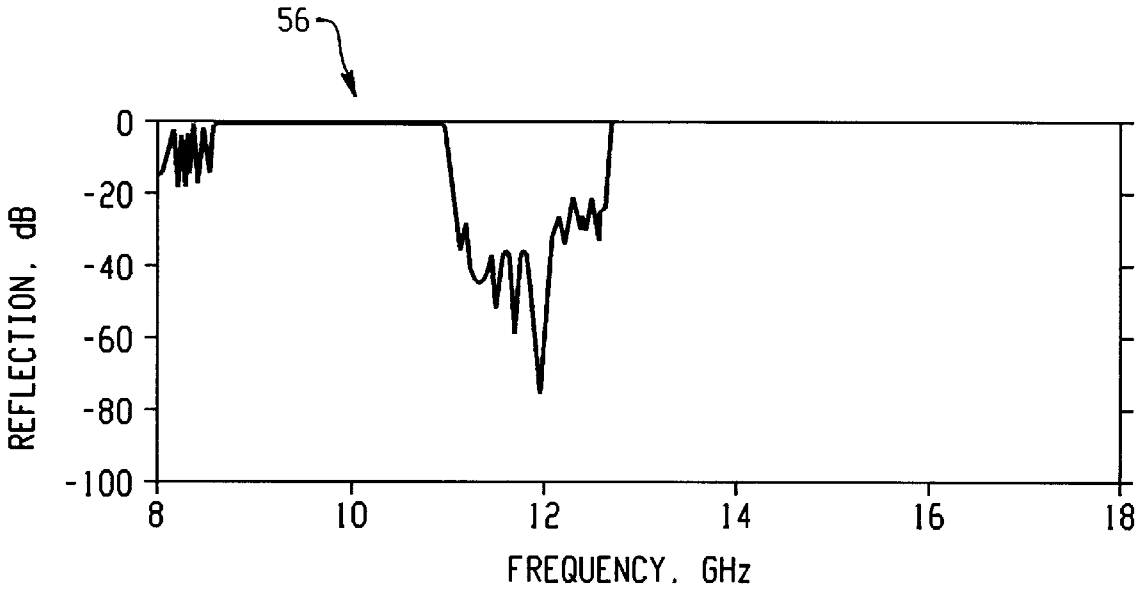
FIG. 7B is a plot showing the reflection frequency response of a filter such as shown in FIGS. 1 or 2, in which the resonators are both low-pass and high-pass.

FIGS. 4, 5, 6A, 6B, 7A and 7B are various simulation plots of the transmission and reflection response of a waveguide filter similar to the those set forth in FIGS. 1 and 2. Specifically, FIG. 4 is a plot showing the transmission and reflection frequency response of a low-pass resonator for use with the waveguide filter. FIG. 5 is the same for a high-pass resonator. FIGS. 6A and 6B are plots showing, respectively, the transmission and reflection frequency response of a filter such as shown in FIGS. 1 or 2, in which the resonators are all low-pass. And FIGS. 7A and 7B are plots showing, respectively, the transmission and reflection frequency response of a filter such as shown in FIGS. 1 or 2, in which the resonators are both low-pass and high-pass. In all these simulation plots, frequency is measured on the x-axis in GHz, and frequency response (either transmission or reflection) is measured on the y-axis in dB.

Turning first to FIG. 4, a typical response 30 for a low-pass resonator is shown. The reflection response 32 and the transmission response 34 are graphed together in this plot. This type of resonator is characterized by a slot depth—dimension "h"—that is less than λg/4. The exact depth "h" determines the position of the second-order transmission zeros 38, which, as shown in the plot, are on the high-side of the passband, around 17.5 GHz. The position of the reflection zero 36 is at about 12 GHz—within the pass-band of the filter—and its exact location is determined by the distance "d" between the pair of coupled resonator slots.

FIG. 5 shows a similar response plot 40 for a high-pass resonator. Like FIG. 4, this plot shows the reflection response 42 and the transmission response 44. This type of resonator is characterized by a slot depth—dimension "h"—that is greater than λg/4. The exact depth "h" determines the position of the second-order transmission zeros 48, which, as shown in the plot, are on the low-side of the passband, around 11 GHz. The position of the reflection zero 48 is at about 12 GHz—within the pass-band of the filter—and its exact location is determined by the distance "d" between the pair of coupled resonator slots in the high-pass resonator.

FIGS. 6A and 6B set forth the transmission response 50 and reflection response 52 of a waveguide filter similar to those shown in FIG. 1 or 2, in which the resonators 16A or 16B are all of the low-pass type—i.e "h" is less than λg/4 for each of the resonators. As seen in the transmission plot 50 for this type of filter, the roll-off on the low-side of the pass-band (which is between about 10.5 and 12.5 GHz) is less steep than on the high-side of the pass-band due to the multiple transmission zeros contributed by the low-pass resonators. In order to make the filter's performance more symmetrical, high-pass resonator elements can be added to the filter, thus resulting in a frequency response 54, 56 similar to that shown in FIGS. 7A and 7B, where the roll-off on either side of the pass-band is roughly the same.

The remaining drawing figures describe another embodiment of the present invention in which the coupled resonator cavities are arranged in a vertical implementation. The primary advantage of this implementation over FIGS. 1 or 2 (the horizontal configurations) is that it is very small in size.

Figure 8:
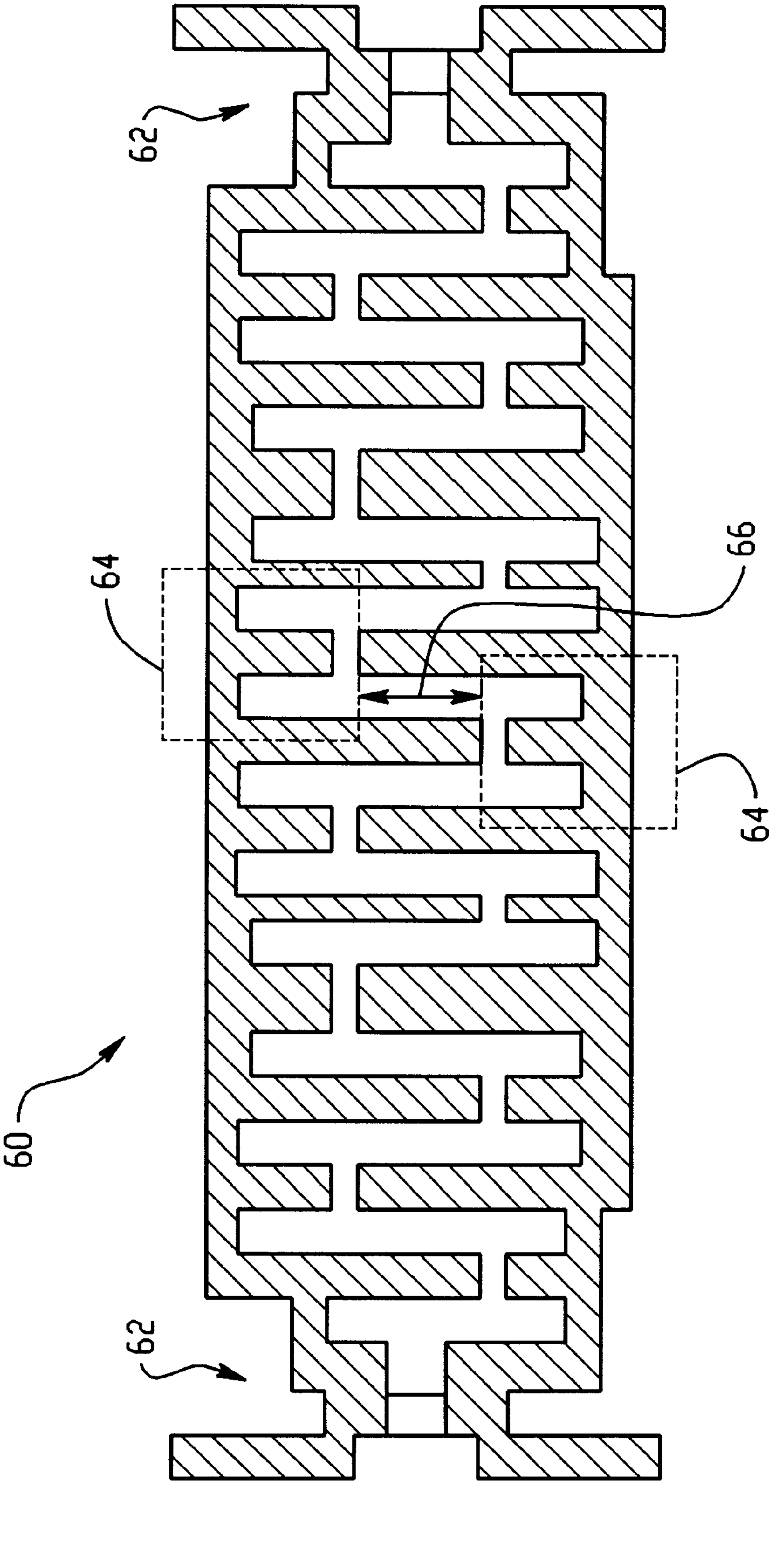
FIG. 8 is an E-plane cross-section of another corrugated waveguide filter according to the present invention, including a plurality of H-stub resonators arranged in a vertical manner.

FIG. 8 is an E-plane cross-section of a corrugated waveguide filter 60 according to the present invention, including a plurality of H-stub resonators 64 arranged in a vertical manner. The input and output of the filter can be ¼ wave transformer sections, similar to those shown in FIGS. 1 and 2, or could be special T-shaped transformer sections 62 having an optional resonant iris element. FIG. 8 shows a filter 60 with the T-shaped transformer sections 62. Between the transformers 62 are the plurality of H-stub resonators 64. Like FIGS. 1 and 2, the number of resonators 64 determines the order of the filter. Each of the resonators 64 provides one reflection zero and a second-order transmission zero to the frequency response of the filter. This filter 60 can be used as a band-pass filter or a low-pass filter, depending on the configuration of the resonators and their positioning with respect to each other.

Each of the resonators 64 is coupled together by a coupling transformer 66, which is a uniform (i.e. non-corrugated) waveguide section that is approximately λg/4 in length, although other distances are possible, including a distance of zero, in which case the resonators are just coupled together from one slot to the next. Quarter-wave coupling transformers 66 are used for implementations of the filter that are band-pass in order to achieve some rejection below the filter pass-band. For low-pass filter types, the coupling transformers 66 are reduced in length in order to provide more rejection on the high-side of the pass-band.

Figure 9:
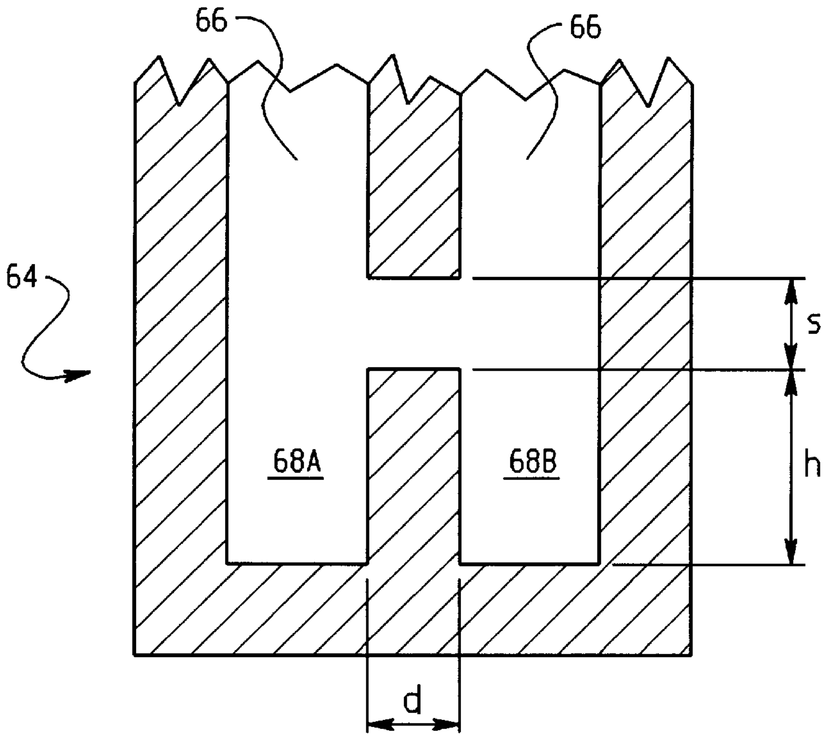
FIG. 9 is an E-plane cross-section of one of the H-stub resonators shown in FIG. 8.

FIG. 9 is an E-plane cross-section of one of the H-stub resonators 64 shown in FIG. 8. The resonator 64 includes a pair of extracted cavities 68A, 68B, which are separated by a distance "d," and connected on either side to the coupling transformers 66. The depth of the extracted cavities is denoted "h," and the height of the section of waveguide coupling the resonators is denoted as "s." Similar to the resonators 16A, 16B in the horizontal implementations, the distance between the cavitites "d" determines the resonant frequency of the resonator couple, and hence the position of the reflection zero. The dimension "h" of the slots determines the position of the transmission zeros, either higher than or lower than the pass-band of the filter. If the dimension "h" is less than $\lambda g/4$, then the transmission zeros are on the high-side of the pass-band, and therefore the resonator is a low-pass type. Alternately, if the dimension "h" is greater than $\lambda g/4$, then the transmission zeros are on the low-side of the pass-band, and therefore the resonator is a high-pass type. For the high-pass type resonator, the distance "h" is typically between $\lambda g/4$ and $\lambda g/2$. The "s" dimension, as well as the "h" dimension, determine the loaded quality factor of the resonator.

Figure 10:
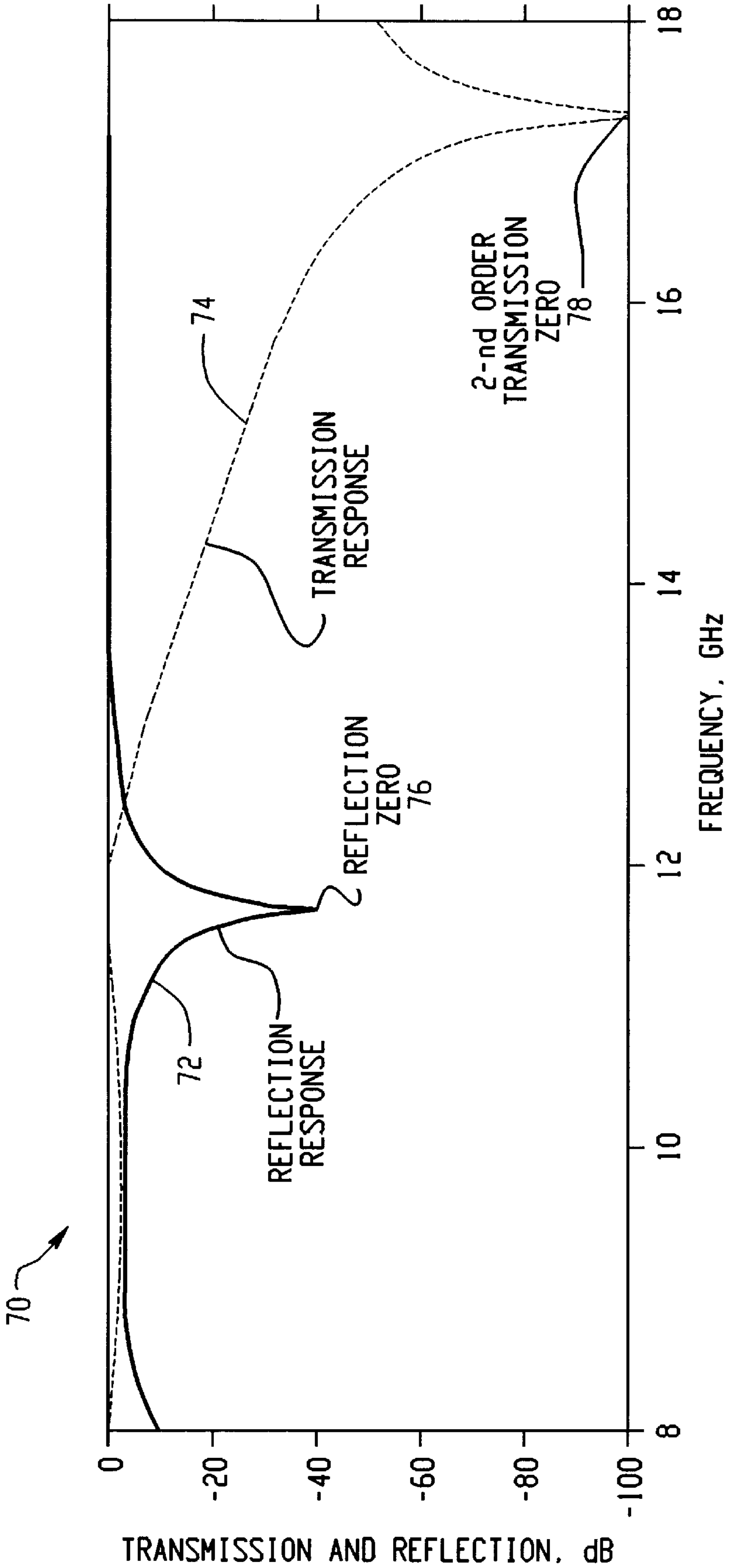
FIG. 10 is a plot showing the transmission and reflection frequency response of a low-pass H-stub resonator.
Figure 11:
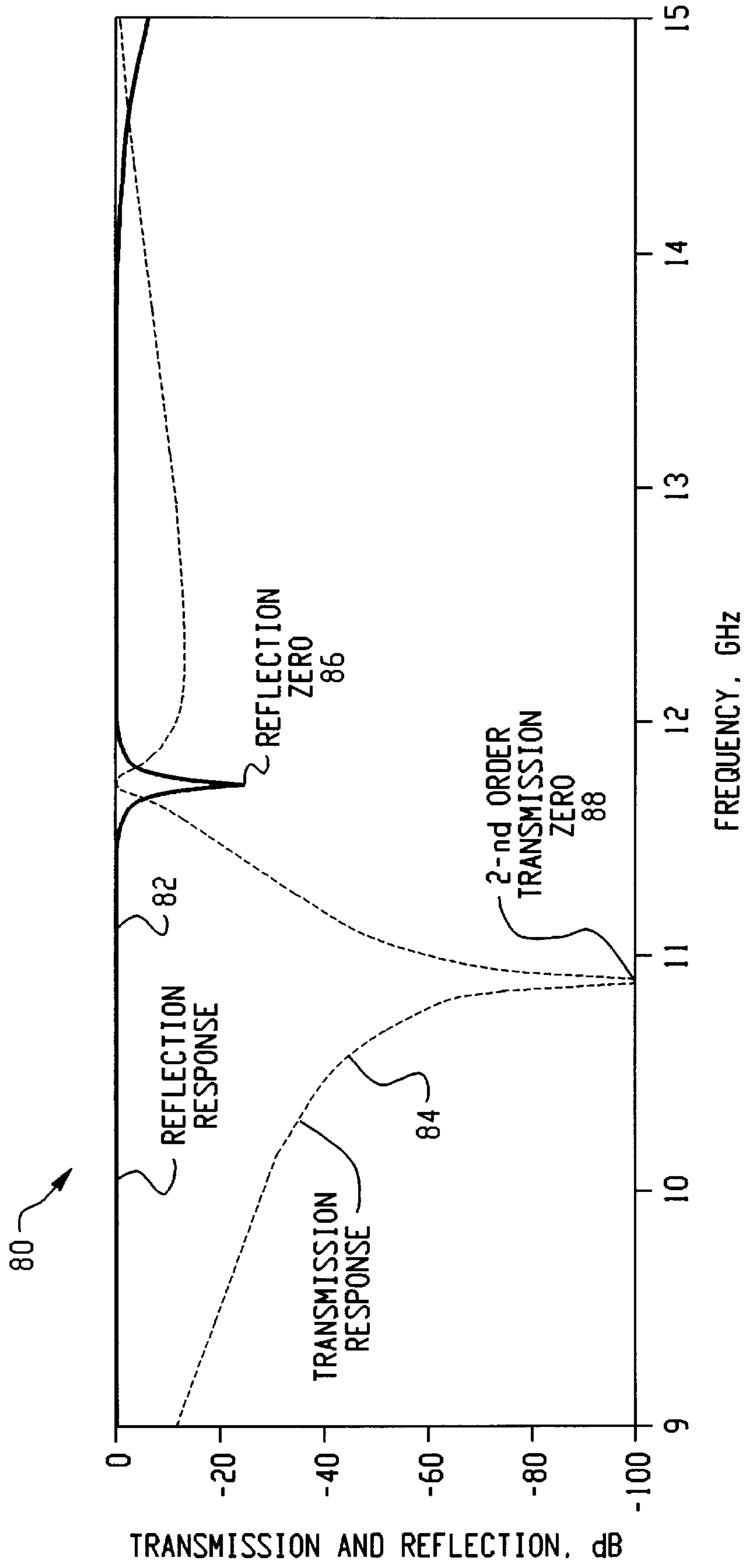
FIG. 11 is a plot showing the transmission and reflection frequency response of a high-pass H-stub resonator.

FIG. 10 is a plot 70 showing the transmission and reflection frequency response of a low-pass H-stub resonator 64, and FIG. 11 is the same 80 for a high-pass resonator. Turning first to FIG. 10, the reflection response 72 shows the positioning of the reflection zero 76 within the pass-band of the filter, around 12 GHz, and because this is a low-pass type resonator, the transmission response 74 shows the second order transmission zero 78 on the high side of the pass-band, around 17.5 GHz. Likewise for the high-pass resonator in FIG. 11, the reflection response 82 shows the positioning of the reflection zero 86 within the pass-band of the filter, around 11.8 GHz, and the transmission response 84 shows the second order transmission zero 88 on the low side of the pass-band, around 10.9 GHz. As noted above, the exact position of the reflection zeros is controlled by the resonator spacing "d," and the exact position of the second order transmission zeros is controlled by the slot depth "h."

Figure 12A:
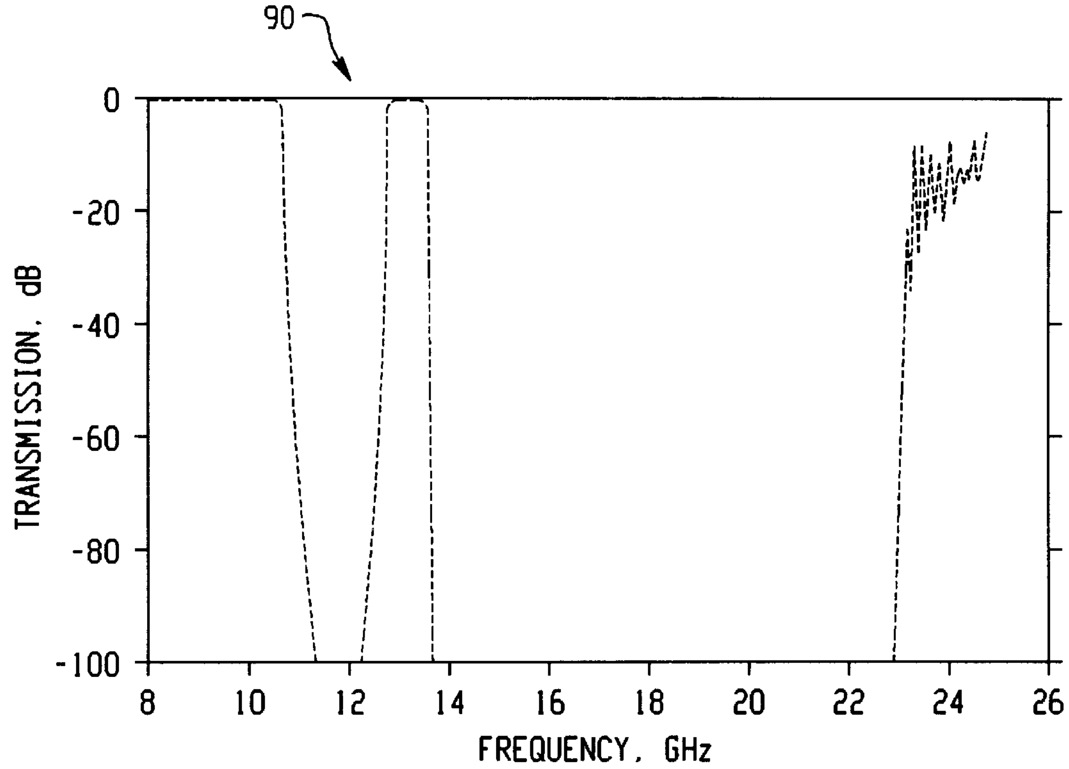
FIG. 12A is a plot showing the transmission frequency response of a waveguide filter such as shown in FIG. 8, in which the resonators are low-pass H-stub type.
Figure 12B:
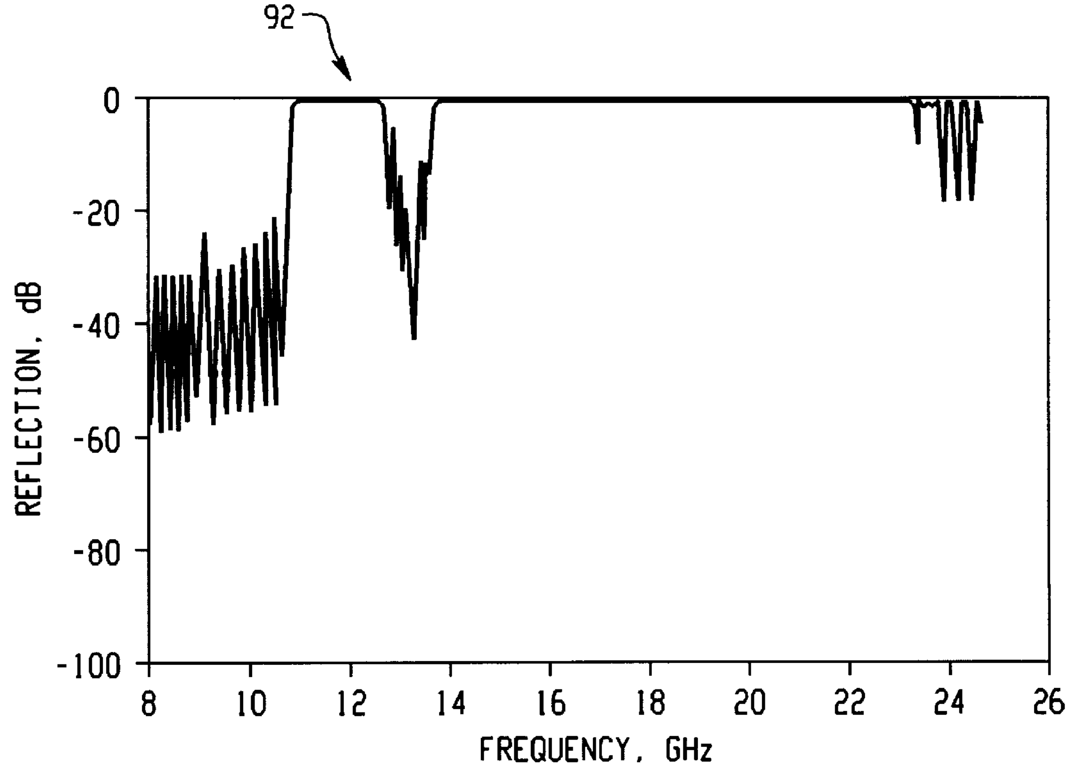
FIG. 12B is a plot showing the reflection frequency response of a waveguide filter such as shown in FIG. 8, in which the resonators are low-pass H-stub type.

FIGS. 12A and 12B are plots showing, respectively, the transmission and reflection frequency response of a waveguide filter such as shown in FIG. 8, in which the resonators are low-pass H-stub type. As shown in these figures, the primary pass-band of this filter is between about 12.1 and 13.8 GHz, with a spurious pass-band below about 10 Because this filter is implemented with low-pass type resonators, the roll-off above the pass-band is typically sharper and the rejection of frequencies is deeper. Both of the pass-bands (primary and spurious) can be utilized for different applications, and if the coupling transformer sections 66 are reduced in length, then the primary pass-band will merge with the spurious pass-band resulting in a low-pass filter design. Alternatively, as described below, by using a special interface transformer with a resonant iris, the spurious pass-band can be attenuated.

This low-pass filter design provides more rejection of high frequencies than a conventional corrugated filter using the same number of extracted cavities or irises. Thus, the present invention provides an improved low-pass filter that is very small and capable of handling high-powered signals. In addition, the insertion loss of a filter according to the present invention is lower than that for a typical corrugated design.

Figure 13:
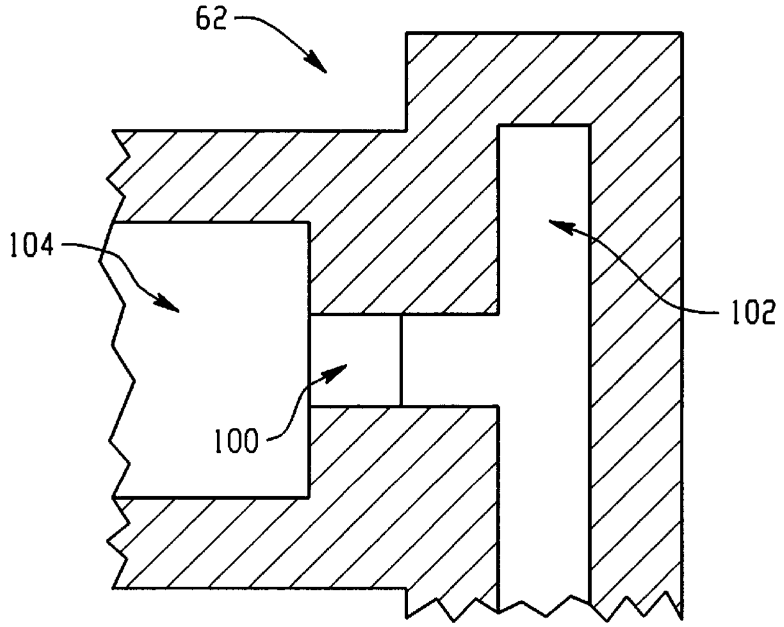
FIG. 13 is an E-plane cross-section of an interface transformer for use with a waveguide filter such as shown in FIG. 8.

FIG. 13 is an E-plane cross-section of an interface transformer 62 for use with a waveguide filter such as shown in FIG. 8. If the filter structure and the interface to external waveguide lines have different cross-sections, or the direction of the input/output ports is to be altered, then the interface transformer 62 can be utilized. On one side of the transformer is the connection 104 to external waveguide, and the other side is a matching stub 102 that connects to the internal waveguide channel. Although FIG. 13 shows a one-step transformer, other types could be utilized with larger numbers of steps between the external waveguide and the internal connection. The matching stub 102 provides an additional advantage in that it provides a transmission zero to the filter's frequency response, thus providing additional rejection.

Optionally, a resonant iris 100 can be used with the transformer 62 in order to provide attenuation of the spurious pass-band in the filter's frequency response.

Figure 14A:
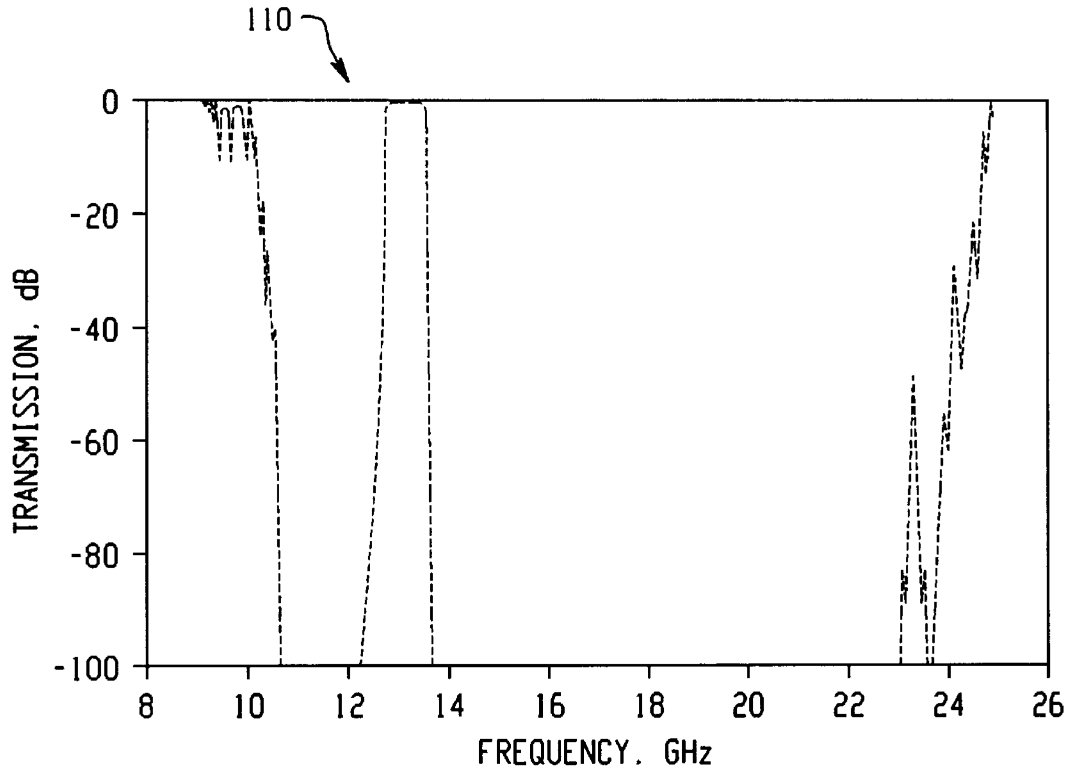
FIG. 14A is a plot showing the transmission frequency response of a waveguide filter such as shown in FIG. 8, using the interface transformer shown in FIG. 13.
Figure 14B:
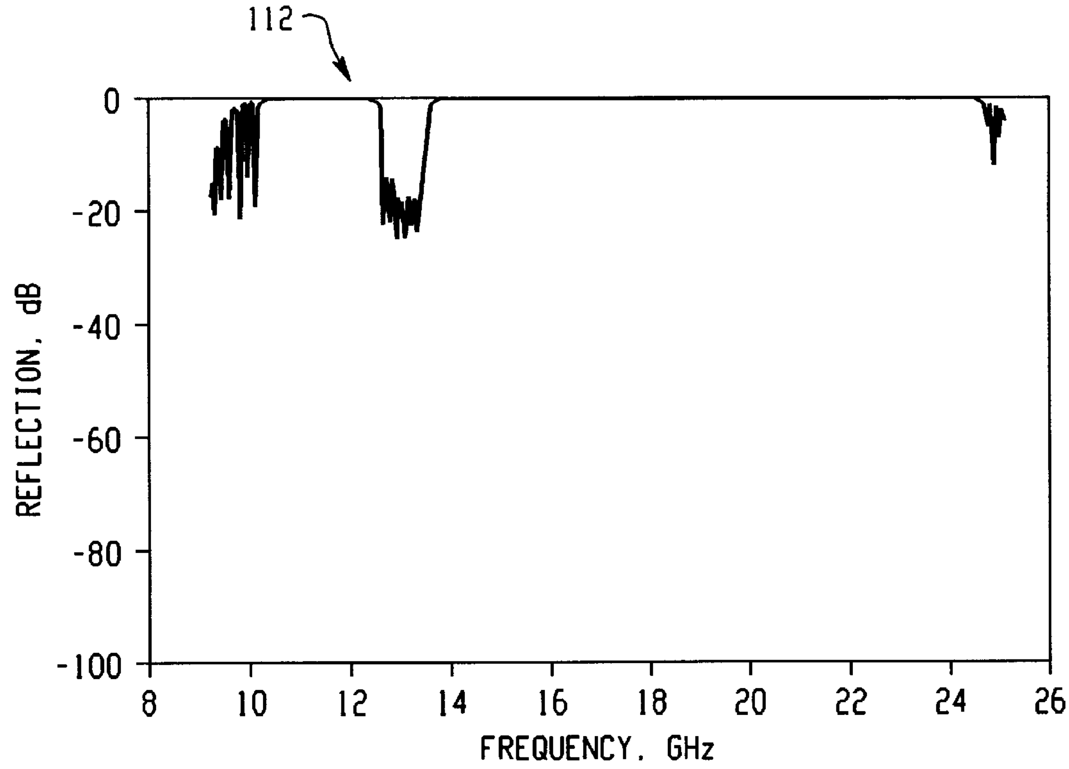
FIG. 14B is a plot showing the reflection frequency response of a waveguide filter such as shown in FIG. 8, using the interface transformer shown in FIG. 13.

FIGS. 14A and 14B are plots 110, 112 showing, respectively, the transmission and reflection frequency response of a waveguide filter such as shown in FIG. 8, using the interface transformer 62 shown in FIG. 13. As compared to FIGS. 12A and 12B, these figures show the additional rejection in the spurious pass-band provided by the transmission zero added by the interface transformer.

Figure 15A:
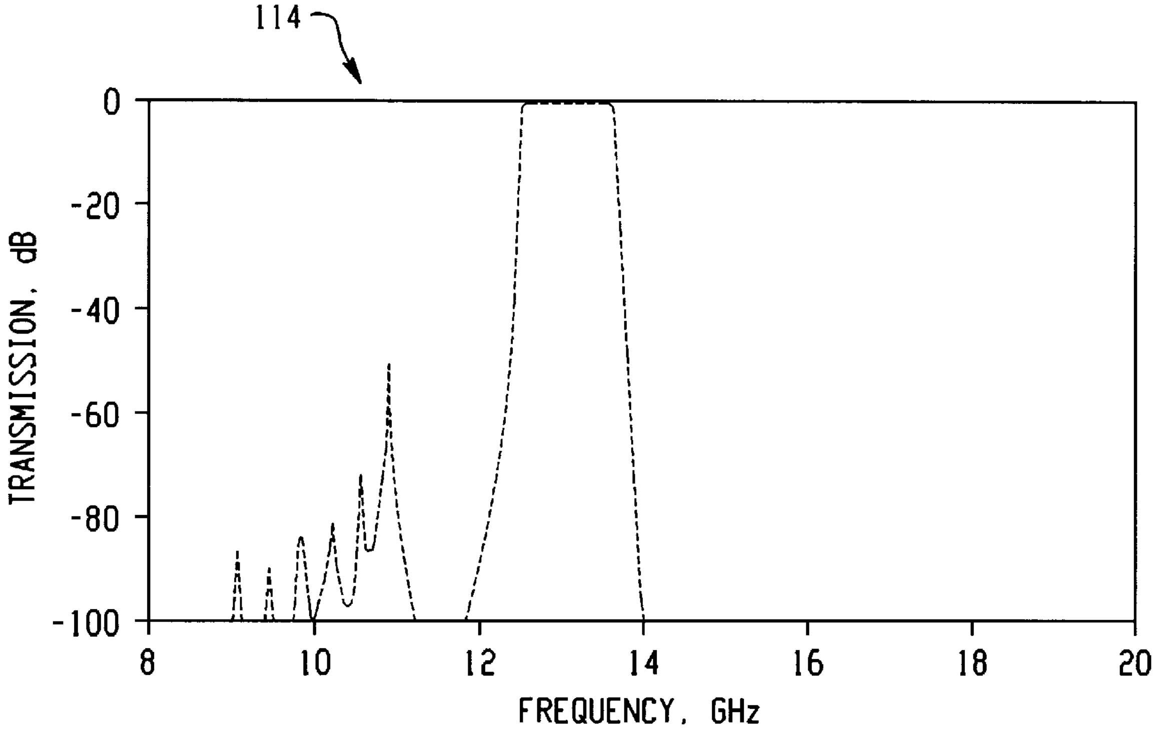
FIG. 15A is a plot showing the transmission frequency response of a waveguide filter such as shown in FIG. 8, using the interface transformer shown in FIG. 13 with an optional resonant iris.
Figure 15B:
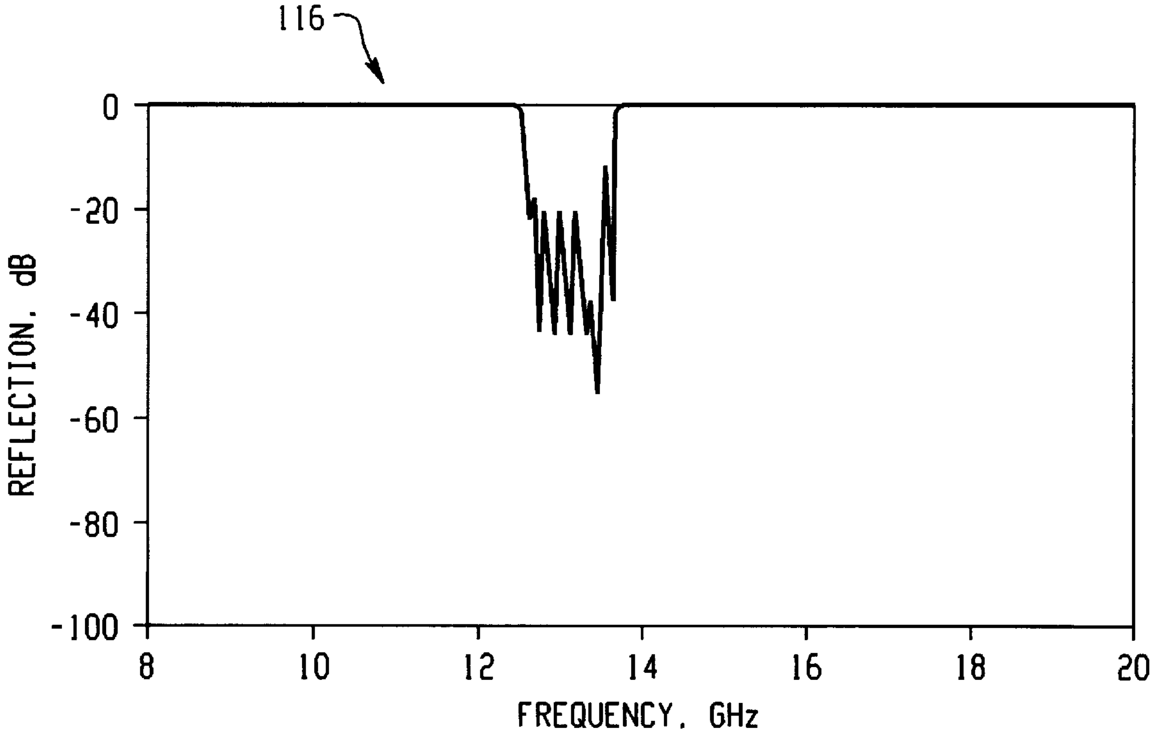
FIG. 15B is a plot showing the reflection frequency response of a waveguide filter such as shown in FIG. 8, using the interface transformer shown in FIG. 13 with an optional resonant iris.

FIGS. 15A and 15B are plots 114, 116 showing, respectively, the transmission and reflection frequency response of a waveguide filter such as shown in FIG. 8, using the interface transformer shown in FIG. 13 with an optional resonant iris 100. As seen in these plots, the addition of the resonant iris 100 provides a great deal of suppression on the low-side of the pass-band thus removing the spurious pass-band from the filter's frequency response.

The preferred embodiments of the invention described with reference to the drawing figures are presented only as examples of the present invention, which is limited only by the claims. Other elements, steps, methods and techniques that are insubstantially different from those described herein are also within the scope of the invention.

What is claimed:

1. A corrugated waveguide filter, comprising:

an input transformer section and an output transformer section for connecting the waveguide filter to external waveguide lines, wherein each transformer section includes at least one stepped waveguide section and provides a reflection zero to the frequency response of the filter; and a filter section coupled between the input transformer section and the output transformer section, the filter section including a waveguide channel and a plurality of coupled resonator cavities, wherein each coupled resonator cavity provides a reflection zero and two transmission zeros to the frequency response of the filter, wherein one of the input transformer section or the output transformer section includes a resonant iris.

2. A corrugated waveguide filter, comprising:

an input transformer section and an output transformer section for connecting the waveguide filter to external waveguide lines, wherein each transformer section includes at least one stepped waveguide section and provides a reflection zero to the frequency response of the filter; and a filter section coupled between the input transformer section and the output transformer section, the filter section including a waveguide channel and a plurality of coupled resonator cavities, wherein each coupled resonator cavity provides a reflection zero and two transmission zeros to the frequency response of the filter, wherein the coupled resonator cavities include at least two slots extracted from the waveguide channel.

3. The filter of claim 2, wherein the slots are symmetrical about the waveguide channel.

4. The filter of claim 2, wherein the slots are asymmetrical about the waveguide channel.

5. The filter of claim 2, wherein the reflection zeros are within the passband of the filter, and the transmission zeros associated with a particular resonator are located either above or below the filter passband.

6. The filter of claim 2, wherein the distance between the slots in a particular resonator determines the position of the reflection zero for that resonator.

7. The filter of claim 2, wherein the depth of the slots in a particular resonator determines the position of the two transmission zeros for that resonator.

8. The filter of claim 7, wherein a particular resonator is a high-pass resonator if the depth of the slots is greater than one-quarter of the wavelength of the passband frequency of the filter.

9. The filter of claim 7, wherein a particular resonator is a low-pass resonator if the depth of the slots is less than one-quarter of the wavelength of the passband frequency of the filter.

10. The filter of claim 2, wherein the resonators are horizontally spaced along the waveguide channel by a distance of about one-quarter of the wavelength of the passband frequency of the filter.

11. The filter of claim 2, wherein the resonators are all low-pass resonators.

12. The filter of claim 2, wherein the resonators are a mix of low-pass and high-pass.

13. The filter of claim 2, wherein the filter is made of aluminum.

14. The filter of claim 2, wherein the filter operates between about 2 and 20 GHz.

15. A corrugated waveguide filter, comprising:

an input transformer section and an output transformer section for connecting the waveguide filter to external waveguide lines, wherein each transformer section includes at least one stepped waveguide section and provides a reflection zero to the frequency response of the filter; and a filter section coupled between the input transformer section and the output transformer section, the filter section including a waveguide channel and a plurality of coupled resonator cavities, wherein each coupled resonator cavity provides a reflection zero and two transmission zeros to the frequency response of the filter, wherein the resonators are vertically spaced from one another and are connected by a plurality of vertical coupling transformers.

16. A corrugated waveguide filter, comprising:

a waveguide channel; and a plurality of coupled resonator cavities extracted from the waveguide channel, each resonator cavity including two extracted slots, wherein the distance between the slots in each resonator determines its resonant frequency.

17. The corrugated waveguide filter of claim 16, further comprising:

an input transformer section; and an output transformer section;

wherein the input and output transformer sections couple the waveguide filter to external waveguide lines.

18. The corrugated waveguide filter of claim 16, wherein the slots in each resonator are symmetrically extracted from the waveguide channel.

19. The corrugated waveguide filter of claim 16, wherein the slots in each resonator are asymmetrically extracted from the waveguide channel.

20. The corrugated waveguide filter of claim 16, wherein each resonator contributes one reflection zero and two transmission zeros to the frequency response of the filter.

21. The corrugated waveguide filter of claim 16, wherein the order of the filter is determined by the number of resonators.

22. The corrugated waveguide filter of claim 20, wherein the depth of the slots in each resonator determine the position of the transmission zeros.

23. The corrugated waveguide filter of claim 16, wherein the resonators include low-pass resonators and high-pass resonators.

24. The corrugated waveguide filter of claim 23, wherein the low-pass resonator is characterized by a slot depth that is less than one-quarter of a wavelength of the passband of the filter.

25. The corrugated waveguide filter of claim 23, wherein the high-pass resonator is characterized by a slot depth that is greater than one-quarter of a wavelength of the passband of the filter.

26. The corrugated filter of claim 16, wherein the resonators are horizontally spaced by a section of waveguide channel approximately one-quarter of a wavelength of the passband of the filter.

27. The corrugated filter of claim 16, wherein the resonators are vertically spaced from each other by a plurality of coupling transformers.

28. The corrugated filter of claim 27, wherein the coupling transformers are approximately one-quarter of a wavelength of the passband of the filter.

29. A corrugated waveguide filter, comprising:

a plurality of horizontally-spaced coupled resonator cavities, wherein each resonator contributes one reflection zero and two transmission zeros to the frequency response of the filter; and a plurality of coupling transformers for connecting the resonator cavities, wherein each coupling transformer vertically connects two resonator cavities.

30. The corrugated filter of claim 29, further comprising:

an input transformer section and an output transformer section for coupling the waveguide filter to external waveguide line.

31. The corrugated filter of claim 30, wherein at least one of the input transformer section or output transformer section includes a resonant iris.

* * * * *